(12) United States Patent
Greenhill et al.

(10) Patent No.: US 9,862,846 B2
(45) Date of Patent: Jan. 9, 2018

(54) PRINTABLE COMPOSITIONS USEFUL IN ELECTRONIC APPLICATIONS AND METHODS RELATING THERETO

(71) Applicant: E I DU PONT DE NEMOURS AND COMPANY, Wilmington, DE (US)

(72) Inventors: David Andrew Greenhill, South Gloucestershire (GB); Vincenzo Arancio, Bristol (GB); Jay Robert Dorfman, Durham, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 16 days.

(21) Appl. No.: 14/719,630

(22) Filed: May 22, 2015

(65) Prior Publication Data

US 2015/0337148 A1 Nov. 26, 2015

Related U.S. Application Data

(60) Provisional application No. 62/001,688, filed on May 22, 2014.

(51) Int. Cl.
| | | |
|---|---|---|
| *C09D 11/108* | (2014.01) |
| *C08K 3/04* | (2006.01) |
| *C08K 3/08* | (2006.01) |
| *H01L 21/288* | (2006.01) |
| *H01L 31/0224* | (2006.01) |
| *H01L 51/52* | (2006.01) |
| *C09D 11/033* | (2014.01) |
| *C09D 11/106* | (2014.01) |
| *C09D 11/322* | (2014.01) |
| *C09D 11/52* | (2014.01) |

(52) U.S. Cl.
CPC .............. *C09D 11/108* (2013.01); *C08K 3/04* (2013.01); *C08K 3/08* (2013.01); *C09D 11/033* (2013.01); *C09D 11/106* (2013.01); *C09D 11/322* (2013.01); *C09D 11/52* (2013.01); *H01L 21/288* (2013.01); *H01L 31/0224* (2013.01); *H01L 31/022425* (2013.01); *C08K 2003/0806* (2013.01); *H01L 51/5203* (2013.01)

(58) Field of Classification Search
CPC ..... C09D 11/108; C09D 11/52; H01L 21/288; H01L 51/5203
See application file for complete search history.

(56) References Cited

U.S. PATENT DOCUMENTS

2010/0076201 A1* 3/2010 Suzuki ................. C07D 209/86
548/405
2015/0024326 A1* 1/2015 Nawrocki ............. G03F 7/0045
430/280.1

FOREIGN PATENT DOCUMENTS

WO WO/2006076610 A2 7/2006

* cited by examiner

*Primary Examiner* — Raj R Gupta

(57) ABSTRACT

A printable ink for electronic applications is disclosed. The ink contains at least one non-interactive solvent, a binder, optionally one or more particulate fillers that may be conductive, semi-conductive or non-conductive, optionally a co-solvent and optionally other additives.

10 Claims, No Drawings

PRINTABLE COMPOSITIONS USEFUL IN ELECTRONIC APPLICATIONS AND METHODS RELATING THERETO

FIELD OF THE INVENTION

The field of the invention is printable compositions (e.g., inks) for electronic type applications, such as for printing electrodes onto solvent sensitive substrates. More specifically, the printable compositions of the present disclosure contain one or more solvents, including at least one non-interactive solvent, a binding resin and optionally conductive particles and/or other fillers.

BACKGROUND OF THE INVENTION

Broadly speaking, printable inks for electronic applications are known. International patent publication WO/2006076610, (PCT/US2006/001298), to Kowalski, et al. is directed to processes for controlling ink migration during the formation of printable electronic features. A need exists for improved printable inks for electronic applications, particularly for printing delicate and sensitive electronic features onto delicate substrates. For example, thin film transistor ("TFT") substrates can be particularly susceptible to unwanted solvent interference or modification of the substrate, where the applied ink (for the purpose of forming an electronic component) has one or more solvents able to cause harm to the sensitive TFT substrate.

SUMMARY OF THE INVENTION

The present invention is directed to inks for electronic type applications. The inks comprise a non-interactive solvent, a binder, optionally one or more particulate fillers that may be conductive, semi-conductive or non-conductive, optionally a co-solvent and optionally other additives.

DETAILED DESCRIPTION

Non-Interactive Solvent Component

The conductive inks of the present disclosure comprise a non-interactive solvent. Non-interactive solvent is intended to mean a solvent that does not unduly harm the substrate upon which the ink is applied. Such harm can be detected by: i. placing a modest current (such as 100 milliamps and 100 volts) across a small (such as, 10 cm by 10 cm area by 1 millimeter in depth) sample of the substrate and measuring the resistivity as the substrate surface is doused with the solvent and then the solvent is slowly (e.g., for a period greater than at least ten minutes) and completely volatilized off of the substrate; ii. if the resistivity changes by less than 10% when doused with the solvent, then for purposes of the present disclosure, the solvent is non-interactive with respect to that particular substrate; iii. if the resistivity changes by more than 10% when doused with the solvent but then goes back to less than 10% after the solvent is slowly (e.g., over a period of time greater than ten minutes) and completely volatilized off of the substrate, then the solvent is non-interactive for purposes of the present disclosure; and iv. if the resistivity changes by more than 10% after being doused with the solvent and the resistivity change remains above 10% after the solvent is slowly and completely volatilized off of the substrate, then the solvent is not non-interactive with regard to that particular substrate.

The non-interactive solvents of the present disclosure are alkanes, whether linear, branched or cyclic. In one embodiment the non-interactive solvent is a halogen substituted or an unsubstituted alkane having a flash point above 25° C. In one embodiment, the non-interactive solvents of the present disclosure have nine or more carbon atoms. In one embodiment the non-interactive solvent comprises (or is derived from) one or more of the following:
1. decalin;
2. bicyclohexyl,
3. decane,
4. undecane, dodecane aromatic hydrocarbons such as toluene, xylene, mesitylene, anisole, chlorobenzene, dichlorobenzene, trichlorobenzene, trifluoromethyl benzene, dichlorobenzotrifluoride, and trifluoromethyl chlorobenzene; derivatives thereof such as chlorine substitution products and fluorine substitution products; naphthalene derivatives such as tetralin and decalin; and
5. cyclic ether compounds such as tetrahydrofuran, tetrahydropyran, and oxetane.

The above listed solvents can be suitably used alone or as a mixed solvent containing two or more of the above solvents.

Co-Solvents

In addition to the non-interactive solvents, a co-solvent can also be (optionally) used in an amount in a range between and optionally including any two of the following weight percentages, based upon the total weight of the non-interactive solvent and co-solvent: 0, 1, 2, 3, 4, 5, 7, 10, 15, 20, 25, 30, 35, 40 and 50 weigh percent. Examples of co-solvents include:
i. alcohols, such as, methanol, ethanol, isopropyl alcohol, and isobutyl alcohol;
ii. esters, such as methyl acetate, ethyl acetate, propyl acetate, isopropyl acetate, and butyl acetate;
iii. ethers, such as ethyl ether and dioxane; ketones such as acetone, methyl ethyl ketone, and methyl butyl ethyl ketone;
iv. glycol ethers, such as propylene glycol monomethyl ether, propylene glycol monomethyl ether acetate, ethylene glycol monoethyl ether, ethylene glycol monoethyl ether acetate, ethylene glycol monobutyl ether, ethylene glycol monomethyl ether, diethylene glycol monomethyl ether, and diethylene glycol monomethyl ether acetate; and
v. alicyclic hydrocarbons, such as cyclohexane, methylcyclohexanone, and
vi. cyclohexanol; and aliphatic hydrocarbons such as n-hexane and heptane.

In one embodiment, the solvent is a mixture of non-interactive solvent and co-solvent, where one solvent has a low boiling point (e.g., 100° C. or lower) and at least one solvent has a relatively higher boiling point (e.g., 150° C. or higher). The lower boiling solvent is generally useful in improving initial fluidity and thin film uniformity. Subsequent to initial thin film formation, the lower boiling solvent can then be volatilized away to increase the viscosity of the coating and induce increased adhesivity to the substrate. The amount of the lower boiling solvent can be adjusted according to the ingredients of the ink, the printing speed, the printing environment, and/or the like. However in some embodiments of the present invention, the amount of this (low boiling) solvent is appropriately adjusted to be in the range of 10% to 90% of the total amount of the solvents of the ink composition. In some embodiments, preferred examples of the quick-drying solvent include hydrocarbon solvents such as cyclohexane; halogenated hydrocarbon solvents such as methylene chloride, tetrachloroethylene, chloroform, carbon tetrachloride, dichloroethane, and trichloroethane; and cyclic ethers such as tetrahydrofuran, oxetane, and tetrahydropyran. In addition, other examples include alcohols such as methanol, ethanol, and propanol; esters such as methyl acetate, ethyl acetate, and isopropyl acetate; ketones such as acetone and methyl ethyl ketone; and aliphatic hydrocarbons such as n-hexane. These co-solvents may be used alone or as a mixed solvent of two or more low boiling solvents. Broadly speaking, the amount of optional co-solvent is appropriately adjusted to be in the range of 0% to 50% of the total amount of the solvents of the ink.

Resin Component

The choice of resin component relates to the resin solubility in the (ink) solvent(s), where the higher the solubility, the better, while also providing limited or no interaction with the materials in the various layers or substrates that the inks of the current invention will be used to coat. In one embodiment, the resin component is a polymer or copolymer of polyethylene, polypropylene, halogenated polyethylene, halogenated polypropylene, halogenated polyolefin and any combination thereof, provided at least 50, 60, 70, 80, 85, 90, 92, 94, 96, 98, 99 or 100 weight percent of the polymer is polyethylene, polypropylene, halogenated polyethylene or halogenated polypropylene (or other halogenated polyolefin) or any combination thereof.

In one embodiment, the resin component comprises a poly alpha-olefin, where the monomer from which the polymer is partially or wholly derived is an alkene where the carbon-carbon double bond starts at the $\alpha$-carbon atom, i.e. the double bond is between the #1 and #2 carbons in the monomer. Alpha-olefins such as 1-hexene or 1-decene may be used as co-monomers to provide an alkyl branched polymer for use as a resin component of the present disclosure. The pendant alkyl groups can shape themselves in numerous conformations, causing difficulty for the polymer to align itself side-by-side in an orderly way. This results in lower contact surface area between the molecules and decreases the intermolecular interactions between molecules, which in turn tends to inhibit crystallization or solidification; the decreased crystallization and/or solidification tends to impart a level (in some embodiments, a relatively small but perceptible level) of oily liquid characteristic to the resin component even at low temperatures, depending upon the selection and amount of alpha olefin copolymer.

Polyethylene copolymerized with a small amount of alpha-olefins (such as 1-hexene, 1-octene, or longer) will generally be more flexible than simple straight chain high density polyethylene, which has no branching. Depending upon the particular embodiment chosen, the methyl branch groups on a polypropylene polymer can be useful in accordance with the present invention.

In one embodiment, the resin component comprises a haloalkane (also known as halogenoalkanes or alky halides, which is an alkane having one or more halogen moieties), or a copolymer where at least one of the repeat units is a haloalkane. The haloalkane can be a primary, secondary or tertiarly haloalkane (or any combination thereof). The halogen moiety can comprise chlorine, bromine, fluorine or iodine. In one embodiment, the halogen is chlorine. The halogen moiety will tend to raise the temperature resistance of the resin, with regard to boiling point, melting point, flammability and the like, which may or may not be useful, depending upon the particular embodiment chosen or desired. Haloalkanes tend to be more polar than non-halogenated alkanes and tend to be more miscible (broadly speaking) with many common polymeric materials, and can be useful depending upon the particular embodiment chosen. The amount of haloalkane in the resin component can be in a range between and optionally including any two of the following weight percentages: 0, 2, 5, 10, 12, 15, 20, 25, 30, 35, 40, 50, 60, 70, 80, 90, 95, 98, and 100 weight percent. In one embodiment, the resin component comprises a cellulose, such as ethyl cellulose, or a derivative thereof. Examples of such resins include ethyl cellulose commonly referred to in the industry as N50 and T10. Other possible resins include acrylates and methacrylates, such as, poly methyl acrylate, poly methyl methacrylate, poly hydroxyl ethyl methacrylate or any combination or derivation thereof.

Other resin compositions are possible in accordance with the present invention, provided the resin composition can be dissolved into the ink and provided the resin composition does not harm or otherwise interfere with the materials the ink is used to coat.

Filler Component

The filler component comprises one or more materials which can be conductive, semi-conductive or non-conductive, depending upon the particular embodiment chosen. Useful conductive particles include metal particles, such as silver, gold, platinum or palladium. Alternatively or in addition, the conductive filler can comprise a conductive organic material, such as, polyacetylene, polypyrrole, polyaniline, their copolymers and PEDOT/PSS. PEDOT/PSS is intended to mean poly(3,4-ethylenedioxythiophene)/polystyrene sulfonate. PEDOT/PSS is a polymer mixture of two ionomers. One component is sodium polystyrene sulfonate which is a sulfonated polystyrene having part of the sulfonyl groups deprotonated to carry a negative charge. The other component poly(3,4-ethylenedioxythiophene) or PEDOT is a conjugated polymer and carries positive charges and is based on polythiophene. Together the charged the charged macromolecules form a macromolecular salt. Other conductive fillers useful in accordance with the present disclosure include carbon, graphite, graphene, silver nano wires, silver coated base metals and the like. Other materials, such as indium tin oxide (ITO) and antimony tin oxide (ATO) and composite materials such as ITO coated mica could also be of use in the current invention, depending upon the particular embodiment selected.

Depending upon the particular embodiment chosen, other useful fillers can be any ceramic, including nitrides, oxides, borides, carbides and the like, e.g., aluminum nitride, boron nitride, titanium dioxide, barium titanate, talc, industrial diamond, and alumina.

Other possible filler materials include an oxide, selenide, telluride, sulfide and arsenide filler materials, such as zinc oxide, cadmium selenide, zinc telluride, cadmium sulfide and indium arsenide would also be useful in the current invention.

The particle size of the filler components can range from several microns down to a few nanometers, depending upon the fabrication methods employed to synthesize or modify the filler particles and the desired end application. For some applications, where the materials of the current invention are deposited onto a very thin layer of sensitive material, the particle size of the filler particles can be crucial. Over-sized particles have the tendency to cause damage to the underlying layer, and the creation of short circuits are a possibility. In one embodiment, the particle has an average size in one dimension in a range between and optionally including any two of the following (in microns): 0.005, 0.010, 0, 0.015, 0.02, 0.03. 0.04, 0.05, 0.06, 0.07, 0.08, 0.09, 0.10, 0.20, 0.30, 0.40, 0.50, 0.60, 0.70, 0.80, 0.90, 1.0, 2.0. 5.0, 10, 20, 25, 30, 40, 50, 60, 70, 80, 90, 100 microns.

EXAMPLES

Example 1

A solution polymer was made by adding 27.75 grams of polyethylene powder ($m_w$ ~35000) to 222.25 grams of bicyclohexyl solvent. The resulting mixture was then heated to a temperature of 60 degrees Celsius until the resin had fully dissolved. The resulting solution was then cooled to room temperature prior to use.

Example 2

A 27.00 gram amount of the solution polymer described in Example 1 was mixed with 108.00 grams of silver powder (surface area 0.6-1.0 $m^2/g$). The resulting mixture was then triple roll milled to yield a smooth homogenous ink. The resulting ink had a solids content of 82.7 wt. % at 150 degrees Celsius and a viscosity of 73 Pa·s at 10 rpm.

Example 3

A 214.75 gram amount of the solution polymer described in Example 1 was mixed with 2.5 grams of bicyclohexyl solvent, 16.38 grams of pelletised carbon black powder (surface area ~254 $m^2/g$) and 16.38 grams of graphite (particle size 8-15 microns). The resulting mixture was then triple roll milled to yield a smooth homogenous ink. The resulting ink had a solids content of 22.7 wt. % at 150 degrees Celsius and a viscosity of 71 Pa·s at 10 rpm.

Example 4

A solution polymer was made by adding 20.00 grams of a chlorinated polyolefin resin powder (chlorine content 18-23 wt. %) to 80.00 grams of bicyclohexyl solvent. The resulting mixture was then heated to a temperature of 60 degrees Celsius until the resin had fully dissolved. The resulting solution was then cooled to room temperature prior to use. In the production of the various inks described below, this composition was remade numerous times.

Example 5

A 98.60 gram amount of the solution polymer described in Example 4 was mixed with 13.46 grams of pelletized carbon black powder (surface area ~254 $m^2/g$) and 13.46 grams of graphite powder (particle size 8-15 microns). The resulting mixture was then triple roll milled to yield a smooth, homogenous ink. The resulting ink had a solids content of 36.4 wt. % at 150 degrees Celsius and a viscosity of 193 Pa·s at 10 rpm.

Example 6

An 85.85 gram amount of the solution polymer described in Example 4 was mixed with 7.68 grams of pelletized carbon black powder (surface area ~254 $m^2/g$) and 20.47 grams of graphite (particle size 8-15 microns). The resulting mixture was then triple roll milled to yield a smooth, homogenous ink with a viscosity of 124 Pa·s at 10 rpm. Sufficient bicyclohexyl solvent was then added to reduce the solids and viscosity to an acceptable range. The resulting ink had a solids content of 38.0 wt. % at 150 degrees Celsius and a viscosity of 111 Pa·s at 10 rpm.

Example 7

A 95.25 gram amount of the solution polymer described in Example 4 was mixed with 3.75 grams of bicyclohexyl solvent and 26.0 grams of graphite powder (particle size 8-15 microns). The resulting mixture was then triple roll milled to yield a smooth, homogenous ink. The resulting ink had a solids content of 36.5 wt. % at 150 degrees Celsius and a viscosity of 26.9 Pa·s at 10 rpm.

Example 8

A 95.25 gram amount of the solution polymer described in Example 4 was mixed with 26.0 grams of pelletized carbon black powder (surface area ~254 $m^2/g$). The resulting mixture was then triple roll milled to yield a smooth, homogeneous ink with a viscosity of 569 Pa·s at 10 rpm, Sufficient bicyclohexyl solvent was then added to reduce the solids and viscosity to an acceptable range. The resulting ink had a solids content of 32.2 wt. % at 150 degrees Celsius and a viscosity of 140 Pa·s at 10 rpm.

Example 9

A 107.31 gram amount of the solution polymer described in Example 4 was mixed with 25.59 grams of pelletized carbon black powder (surface area ~254 $m^2/g$) and 9.60 grams of graphite (particle size 8-15 microns). The resulting mixture was then triple roll milled to yield a smooth, homogeneous ink with a viscosity of 658 Pa·s at 10 rpm. Sufficient bicyclohexyl solvent was then added to reduce the solids and viscosity to an acceptable range. The resulting ink had a solids content of 33.0 wt. % at 150 degrees Celsius and a viscosity of 157 Pa·s at 10 rpm.

Example 10

A 59.4 gram amount of the solution polymer described in Example 4 was mixed with 4.05 grams of pelletized carbon black powder (surface area ~254 $m^2/g$), 4.05 grams of graphite (particle size 8-15 microns) and 78.00 grams of silver powder (surface area 0.6-1.0 $m^2/g$). The resulting mixture was then triple roll milled to yield a smooth, homogeneous ink with a viscosity of 245 Pa·s at 10 rpm. Sufficient bicyclohexyl solvent was then added to reduce the solids and viscosity to an acceptable range. The resulting ink had a solids content of 61.3 wt. % at 150 degrees Celsius and a viscosity of 109 Pa·s at 10 rpm.

Example 11

A 102.12 gram amount of the solution polymer described in Example 4 was mixed with 29.37 grams of pelletized carbon black powder (surface area ~254 $m^2/g$) and 11.01 grams of graphite (particle size 8-15 microns). The resulting mixture was then triple roll milled to yield a smooth, homogeneous ink with a viscosity of 766 Pa·s at 10 rpm. Sufficient bicyclohexyl solvent was then added to reduce the solids and viscosity to an acceptable range. The resulting ink had a solids content of 34.1 wt. % at 150 degrees Celsius and a viscosity of 116 Pa·s at 10 rpm.

Example 12

A 112.50 gram amount of the solution polymer described in Example 4 was mixed with 21.81 grams of pelletized carbon black powder (surface area ~254 m²/g) and 8.19 grams of graphite (particle size 8-15 microns). The resulting mixture was then triple roll milled to yield a smooth, homogeneous ink with a viscosity of 241 Pa-s at 10 rpm. Sufficient bicyclohexyl solvent was then added to reduce the solids and viscosity to an acceptable range. The resulting ink had a solids content of 32.4 wt. % at 150 degrees Celsius and a viscosity of 103 Pa·s at 10 rpm.

What is claimed is:

1. A printable ink for use in the production of an electronic device, comprising:
   a. one or more non-interacting solvents,
   b. a binding resin, which is a polymer or copolymer of polyethylene, polypropylene, halogenated polyethylene, halogenated polypropylene, halogenated polyolefin and any combination thereof, with the proviso that at least 50 weight percent of the polymer is polyethylene, polypropylene, halogenated polyethylene or halogenated polypropylene or any combination thereof, and wherein the binding resin is soluble in the non-interacting solvent; and
   c. a filler.

2. A printable ink in accordance with claim 1, wherein the binding resin is a copolymer comprising an alpha olefin where the pendant alkyl group has more than one carbon atom.

3. A printable ink in accordance with claim 1, wherein the binding resin comprises a haloalkane or a copolymer where at least one of the repeat units is a haloalkane.

4. A printable ink in accordance with claim 1, wherein the filler comprises one or more of the following: carbon, graphite, graphene, silver, gold, platinum, and silver coated base metal.

5. A printable ink in accordance with claim 1, wherein the filler comprises one or more of the following: aluminum nitride, boron nitride, titanium dioxide, barium titanate, talc, industrial diamond, alumina.

6. A printable ink in accordance with claim 1, wherein the non-interacting solvent comprises one or more of the following: decalin, bicyclohexyl, decane, undecane, and dodecane.

7. A printable ink in accordance with claim 1, where the binding resin is selected from one or more of the following: polyethylene, polypropylene, halogenated polyolefins, and copolymers and derivatives thereof.

8. A method of printing an electrode on a solvent sensitive substrate comprising the step of place a printable ink on the substrate, where the ink composition is in accordance with the ink of claim 1.

9. A method in accordance with claim 8, where the solvent sensitive substrate is a member of the group consisting of: a polymeric OLED substrate layer, an amorphous silica based solar cell substrate layer, a polycarbonate and combinations thereof.

10. A method in accordance with claim 8, wherein the placing of the ink is done by screen printing, flexographic printing, gravure coating, stenciling, ink jetting or spraying.

* * * * *